(12) United States Patent
Hopkins et al.

(10) Patent No.: US 11,164,987 B2
(45) Date of Patent: Nov. 2, 2021

(54) SI—GE—SI PHOTOTRANSISTOR

(71) Applicant: Government of the United States as represented by the Secretary of the Air Force, Wright-Patterson AFB, OH (US)

(72) Inventors: Frank K. Hopkins, Beavercreek, OH (US); Shamus P. McNamara, New Salisbury, IN (US); John G. Jones, Dayton, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 16/877,618

(22) Filed: May 19, 2020

(65) Prior Publication Data

US 2021/0057598 A1 Feb. 25, 2021

Related U.S. Application Data

(60) Provisional application No. 62/890,831, filed on Aug. 23, 2019.

(51) Int. Cl.
*H01L 31/11* (2006.01)
*H01L 31/028* (2006.01)
*H01L 31/18* (2006.01)

(52) U.S. Cl.
CPC ........ *H01L 31/1105* (2013.01); *H01L 31/028* (2013.01); *H01L 31/1804* (2013.01)

(58) Field of Classification Search
CPC . H01L 31/1105; H01L 31/028; H01L 31/1804
See application file for complete search history.

(56) References Cited

U.S. PATENT DOCUMENTS

| 4,160,258 | A | * | 7/1979 | Dawson | H01L 29/267 250/551 |
|---|---|---|---|---|---|
| 5,308,785 | A | * | 5/1994 | Comfort | H01L 21/763 257/E21.546 |
| 6,780,725 | B2 | * | 8/2004 | Fujimaki | H01L 21/82285 257/E21.375 |
| 9,786,715 | B2 | | 10/2017 | Na et al. | |
| 2003/0161571 | A1 | * | 8/2003 | Davids | G02B 6/4214 385/14 |
| 2013/0119234 | A1 | * | 5/2013 | Lee | H01L 27/1461 250/208.1 |

(Continued)

OTHER PUBLICATIONS

Going et al., "32 GHz Germanium Bipolar Phototransistors on Silicon Photonics", IEEE Optical Interconnects Conference, pp. 38-39 (2015).

(Continued)

*Primary Examiner* — Sitaramarao S Yechuri
(74) *Attorney, Agent, or Firm* — AFMCLO/JAZ; Charles Figer, Jr.

(57) ABSTRACT

In accordance with various embodiments of the disclosed subject matter, a phototransistor comprises an NPN or PNP phototransistor having a base including a Si-region, a Ge-region, and a Ge—Si interface region wherein photons are absorbed in the Ge region and conduction-band electrons are attracted to the interface region such that the electrons' mobility is enhanced thereby.

20 Claims, 3 Drawing Sheets

(56) References Cited

U.S. PATENT DOCUMENTS

2014/0055648 A1* 2/2014 Yamada ............ H04N 5/35509
348/250
2017/0062508 A1 3/2017 Na et al.
2018/0188356 A1 7/2018 Na et al.

OTHER PUBLICATIONS

Ang et al. "Low-Voltage and High-Responsivity Germanium Bipolar Phototransistor for Optical Detections in the Near-Infrared Regime", IEEE Electron Device Letters, vol. 29, No. 10, pp. 1124-1127, Oct. 2008.
Duan et al., "310 GHz gain-bandwidth product Ge/Si avalanche photodetector for 1550 nm light detection", Optics Express, vol. 20, No. 10, pp. 11031-110367 May 2012.

\* cited by examiner

SI—GE—SI PHOTOTRANSISTOR

CROSS-REFERENCE TO RELATED APPLICATIONS

This application claims the benefit of and priority to U.S. Provisional Application Ser. No. 62/890,831, entitled "Si—Ge—Si Phototransistor," filed on Aug. 23, 2019, the entirety of which is incorporated by reference herein.

GOVERNMENT INTEREST

The invention described herein may be manufactured and used by or for the Government of the United States for all governmental purposes without the payment of any royalty.

FIELD OF THE DISCLOSURE

The present invention generally relates to detecting light using an optical sensor such as a phototransistor configured for sensitivity to 1.55 µm wavelength light.

BACKGROUND

The integration of electronics and photonics on a common substrate has been recognized as a means to move beyond the performance limitations of purely electronic signal processing. One of the common wavelengths used within optical communications is 1.55 µm. At this wavelength, germanium's absorption constant is extremely large due to direct band-to-band transitions across germanium's energy bandgap. As such, germanium (Ge) integrated with silicon (Si) is the basis of several photodetector technologies.

Currently available photodetectors cannot fully meet future requirements for speed, form/shape, and responsivity of many sensor systems that are integral to future systems that incorporate photonic integrated circuits (PICs). The most common choice of a photodetector is a photodiode, but photodiodes are limited due to poor responsivity. Although the responsivity can be significantly increased by incorporating an avalanche region into the photodiode, other limitations then appear including the form/shape of the device, the complexity of the fabrication processes, and the required precise control of the Ge film thicknesses.

A Si—Ge—Si phototransistor seems to offer a photodetector with high internal gain and therefore high responsivity. Two Ge phototransistors, compatible with silicon, have previously been discussed in the technical literature for which only one was demonstrated (see, e.g., K-W Ang et al., IEEE Electron Device Letters 29 (2008), 1124, and R. Going et al., IEEE Optical Interconnects Conference (2015). Unfortunately, these devices require complex fabrication processes and precise control of the Ge film thicknesses.

SUMMARY OF THE INVENTION

Various deficiencies in the prior art are addressed below by a phototransistor comprising an NPN or PNP phototransistor having a base including a Si-region, a Ge-region, and a Ge—Si interface region wherein photons are absorbed in the Ge region and conduction-band electrons are attracted to the interface region such that the electrons' mobility is enhanced thereby.

A NPN embodiment of the phototransistor comprises a p-type silicon substrate having a surface with an elongated $n^-$-doped silicon structure and an elongated $n^+$-doped silicon structure disposed therein in a substantially parallel manner; and an elongated p-type germanium film disposed between the substantially parallel $n^-$-doped silicon structure and $n^+$-doped silicon structure, the elongated p-type germanium film contacting the silicon substrate surface along each of the parallel $n^-$-doped silicon structure and $n^+$-doped silicon structure and having formed therein a necking portion of the silicon substrate having a length $W$ of approximately 10 µm; wherein light having a wavelength transparent to silicon but absorbed by germanium and impinging upon the germanium layer causes a buildup of electrons sufficient to shift a base region such that a shift in voltage between a base and silicon emitter causes a larger and readily detectable injection of electrons from an silicon emitter into the base region.

A PNP embodiment of the phototransistor comprises an n-type silicon substrate having a surface with an elongated $p^-$-doped silicon structure and an elongated $p^+$-doped silicon structure disposed therein in a substantially parallel manner; and an elongated n-type germanium film disposed between the substantially parallel $p^-$-doped silicon structure and $p^+$-doped silicon structure, the elongated n-type germanium film contacting the silicon substrate surface along each of the parallel $p^-$-doped silicon structure and $p^+$-doped silicon structure and having formed therein a necking portion of the silicon substrate having a length $W$ of approximately 10 µm; wherein light having a wavelength transparent to silicon but absorbed by germanium and impinging upon the germanium layer causes a buildup of charge sufficient to shift a base region such that a shift in voltage between a base and silicon emitter causes a larger and readily detectable injection of holes from an silicon emitter into the base region.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

Figure 1:
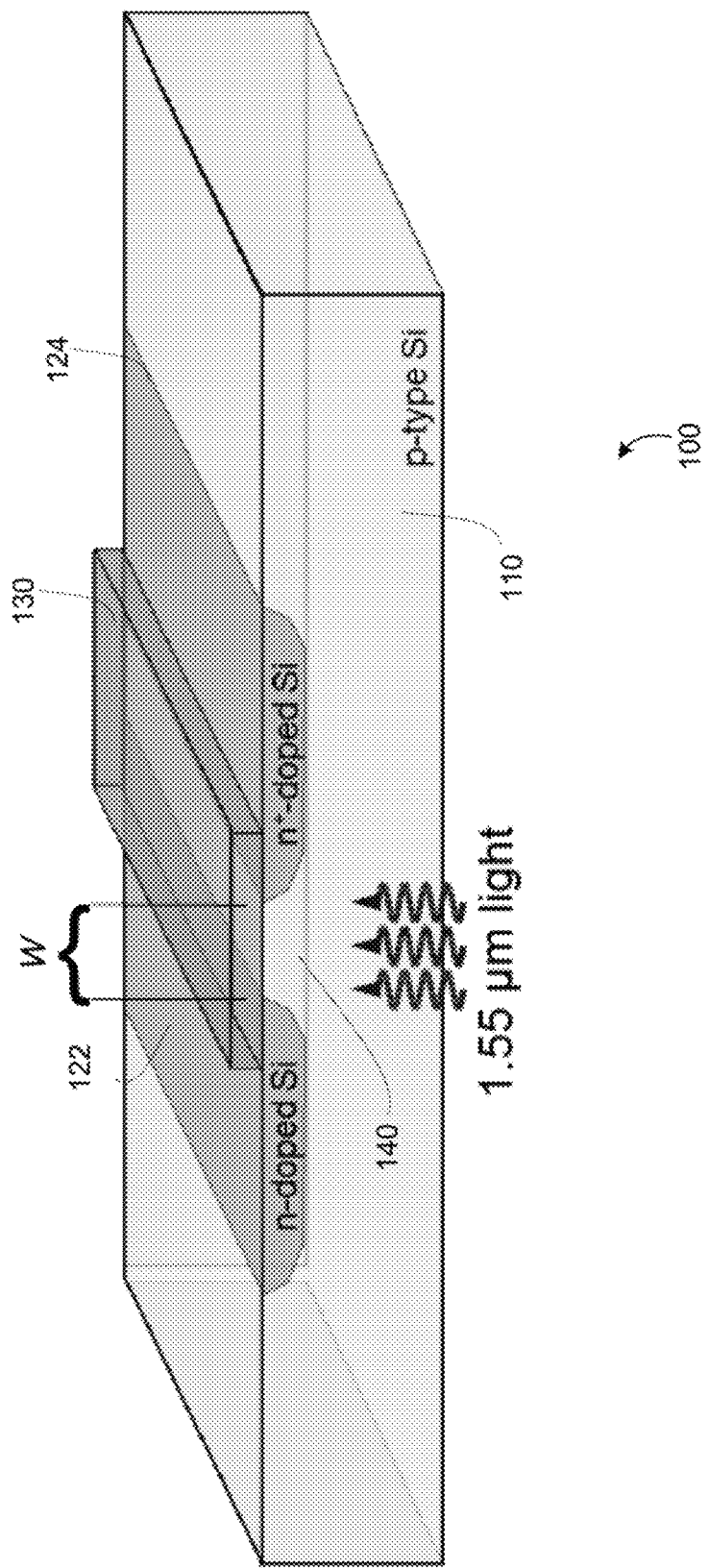
FIG. 1 is a simplified schematic drawing of a cross section of a phototransistor according to an embodiment.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for illustrative purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or, unless otherwise indicated (e.g., "or else" or "or in the alternative"). Also, the various embodiments described herein are not necessarily mutually exclusive, as some embodiments can be combined with one or more other embodiments to form new embodiments.

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments.

Various embodiments provide a phototransistor exhibiting improved performance while utilizing less stringent manufacturing processes, such as a high efficiency Si—Ge—Si phototransistor that can be easily fabricated on a silicon substrate such as by using planar semiconductor manufacturing processes.

Various embodiments provide a device and related process wherein a Si surface (e.g., surface of Si waveguide of a photonic IC) is (1) doped N-type, (2) partially covered by a dielectric material (illustratively SiO2, though any dielectric material capable of being utilized in this manner may be used) forming an insulator that serves to limit a p-type Ge film/layer deposited thereon (3) with an appropriate Si—Ge buffer (4) having many atomic layers such that the Ge is provided as a single crystal or high-quality polycrystalline structure. 1.55 µm light hitting the Ge and building electrons and holes in the Ge/Si base region, which slightly shifts the voltage between the base and the Si emitter, which causes a larger injection of electrons from the Si emitter into the base regions. Since the length of the base of the n-type doped Si surface through the Ge to the second n-type doped-Si service is smaller than the minority carrier diffusion length of electrons in Ge, the injected electrons are caught by the e-field between the base and Si collector. The design is less complex to fabricate than existing devices.

In various embodiments, the base comprises a Si-region, a Ge-region, and a Ge—Si interface region. Photons are absorbed in the Ge region. Conduction-band electrons are attracted to the interface region where the electrons' mobility is enhanced.

Figure 2:
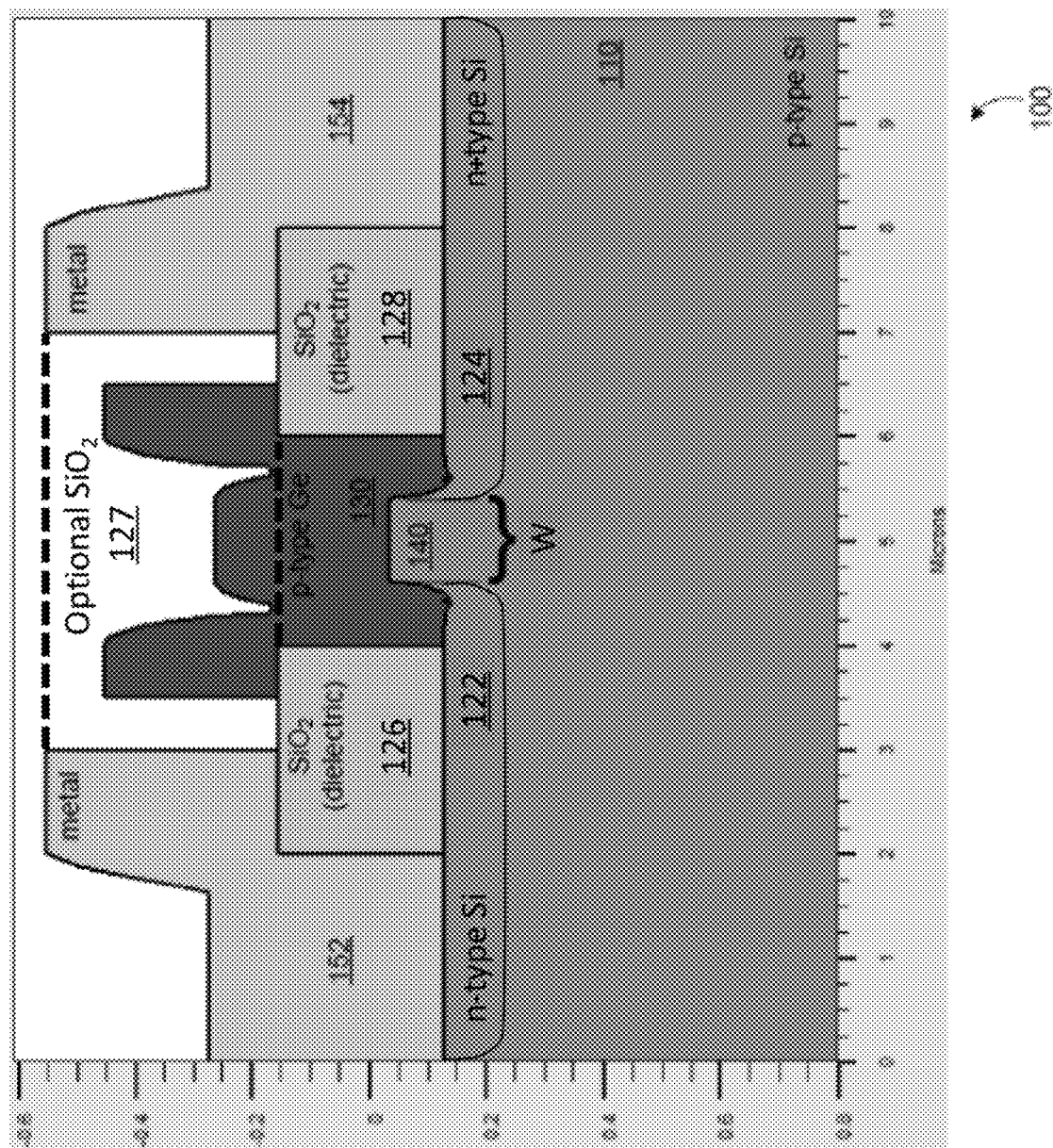
FIG. 2 is a more detailed depiction of a cross section of a phototransistor resulting from a fabrication process according to an embodiment.

FIG. 1 is a simplified schematic drawing of a cross section of a phototransistor according to an embodiment, and FIG. 2 is a more detailed depiction of a cross section of a phototransistor resulting from a fabrication process according to an embodiment. The phototransistor 100 is formed on a surface of a silicon substrate 110, such as the surface of a silicon waveguide of a photonic integrated circuit (PIC). The silicon surface/substrate 110 is doped to be p-type. Using either diffusion or implantation, portions 115 of the silicon surface 110, except for a thin region 140, are doped n-type as depicted.

Specifically, the phototransistor 100 of FIG. 1 comprises a substrate 110, illustratively a p-type Si substrate such as a p-type doped PIC, having disposed thereon an elongated n-doped Si structure 122 and an elongated n$^+$-doped Si structure 124 parallel to the n-doped Si structure 122 such that a "necking" portion 140 of the Si substrate 110 having a length $W$ is disposed therebetween. Further, an elongated layer of relaxed p-type Ge film with a thin Si—Ge buffer 130 is disposed upon and fully covering the necking portion 140, while partially covering each of the n-doped Si structure 122 and elongated n$^+$-doped Si structure 124.

The length $W$ of the "necking" portion 140 of the Si substrate 110 is selected in response to the minority carrier diffusion length $D_n$ for electrons in Ge (where $D_n$=1.1 cm$^2$/sec) multiplied by the a typical minority lifetime of electrons $T_n$=1 µsec. Specifically, $L_n$=sqrt($D_n*T_n$). The inventors have determined that highest gain is achieved when the necking portion length $W$ is less than $L_n$, though gain can be obtained for larger values of $W$. Therefore, in various embodiments, the length $W$ of the "necking" portion 140 of the Si substrate 110 is selected as a length less than: $L_n$=sqrt($D_n*T_n$)=sqrt(1.1 cm$^2$/sec)(1 µsec)=10 µm. In various embodiments, a necking length $W$ was selected by the inventors as 1 µm, 5 µm and other values less than approximately 10 µm.

A dielectric material (e.g., SiO2) 126/128 covers a small region of each of upper surfaces of the n-doped Si structure 122 and elongated n$^+$-doped Si structure 124. As illustrated, the dielectric material 126/128 serves to limit the Ge layer deposited thereon. Careful deposition of the Ge with an appropriate Si—Ge buffer layer, with a thickness of many atomic layers, will insure the Ge is either single crystal or high quality polycrystalline. The n-doped Si structure 122 and elongated n$^+$-doped Si structure 124 extend under the dielectric material 126/128 as well as under metal contacts 152/154.

The n-type Si regions 122/124 function as the device's emitter and collector. The germanium region 130, in combination with an extremely thin silicon layer adjacent to the germanium, functions as the device's base. It should be noted that the length of the base from the n-type doped-Si surface through the Ge to the second n-type doped-Si surface is configured to be smaller than the minority carrier diffusion length of electrons in Ge. It should be noted that the length of the device's base is easily and precisely controlled due to the maturity of photolithography techniques.

The device fabrication is completed with the deposition and defining of metal contacts 152/154 as illustrated.

The sensor 100 of FIGS. 1 and 2 comprises a Si—Ge—Si bipolar junction phototransistor that may be fabricated by standard planar processing techniques for semiconductor devices. During operation, a voltage is applied between the Si emitter 124 and the Si collector 122. When no light exists in the device, a very small dark current is generated. This dark current is very small because the collector-to-base junction is reverse biased.

The device responds to light in the following manner. The silicon substrate is essentially transparent to 1.55 µm light passing through it, but the light is strongly absorbed by the germanium. Thus when light propagates into the Ge, the number of free electrons and holes in the Ge/Si base region are increased. This leads to a very small shift in the built-in voltage between the base and the Si emitter. This in turn controls a much larger injection of electrons from the Si emitter into the base region. Since the base length is less than the minority carrier diffusion length for electrons, most of these injected electrons are then caught by the electric field between the base and the Si collector. It should be noted that while the 1.55 µm wavelength is a targeted wavelength for many applications, the various embodiments include phototransistors that are suitable for detecting any wavelength for which silicon is transparent but Germanium absorbs light, including but not limited to 1.55 µm.

In various embodiments, the dielectric layer (regions 126/128) may include a region 127 such that the dielectric layer coats the entire Germanium layer (region 130).

In various embodiments, the Germanium (region 130) is wholly on top of the silicon regions 122/124 in that Germanium layer (region 130) does not extend over the dielectric regions 126 and 128.

The phototransistor 100 is described above as an NPN transistor. Generally speaking, the NPN embodiment of the phototransistor comprises a p-type silicon substrate having a surface with an elongated n⁻-doped silicon structure and an elongated n⁺-doped silicon structure disposed therein in a substantially parallel manner; and an elongated p-type germanium film disposed between the substantially parallel n⁻-doped silicon structure and n⁺-doped silicon structure, the elongated p-type germanium film contacting the silicon substrate surface along each of the parallel n⁻-doped silicon structure and n⁺-doped silicon structure and having formed therein a necking portion of the silicon substrate having a length $W$ of approximately 10 µm; wherein light having a wavelength transparent to silicon but absorbed by germanium and impinging upon the germanium layer causes a buildup of electrons sufficient to shift a base region such that a shift in voltage between a base and silicon emitter causes a larger and readily detectable injection of electrons from an silicon emitter into the base region.

However, in various embodiment, the phototransistor 100 described herein may be formed as a PNP transistor by reversing the doping types described above with respect to the various regions (i.e., n-type becomes p-type and p-type becomes n-type). A PNP embodiment of the phototransistor comprises an n-type silicon substrate having a surface with an elongated p⁻-doped silicon structure and an elongated p⁺-doped silicon structure disposed therein in a substantially parallel manner; and an elongated n-type germanium film disposed between the substantially parallel p⁻-doped silicon structure and p⁺-doped silicon structure, the elongated n-type germanium film contacting the silicon substrate surface along each of the parallel p⁻-doped silicon structure and p⁺-doped silicon structure and having formed therein a necking portion of the silicon substrate having a length $W$ of approximately 10 µm; wherein light having a wavelength transparent to silicon but absorbed by germanium and impinging upon the germanium layer causes a buildup of charge sufficient to shift a base region such that a shift in voltage between a base and silicon emitter causes a larger and readily detectable injection of holes from an silicon emitter into the base region.

Advantageously, the Si—Ge—Si phototransistor described herein utilizes precise photolithography to fabricate the phototransistor's base width rather than the more difficult to achieve precise control of the deposition thickness of Ge. Further, the Si—Ge—Si phototransistor described herein that utilizes a Si—Ge interface within the base in order to take advantage of the enhanced electron mobility of carriers along the interface for the purpose of improving both speed and gain of the phototransistor.

The phototransistor is useful in many applications in communications, signal processing, control systems for various capabilities such as radar so on.

Figure 3:
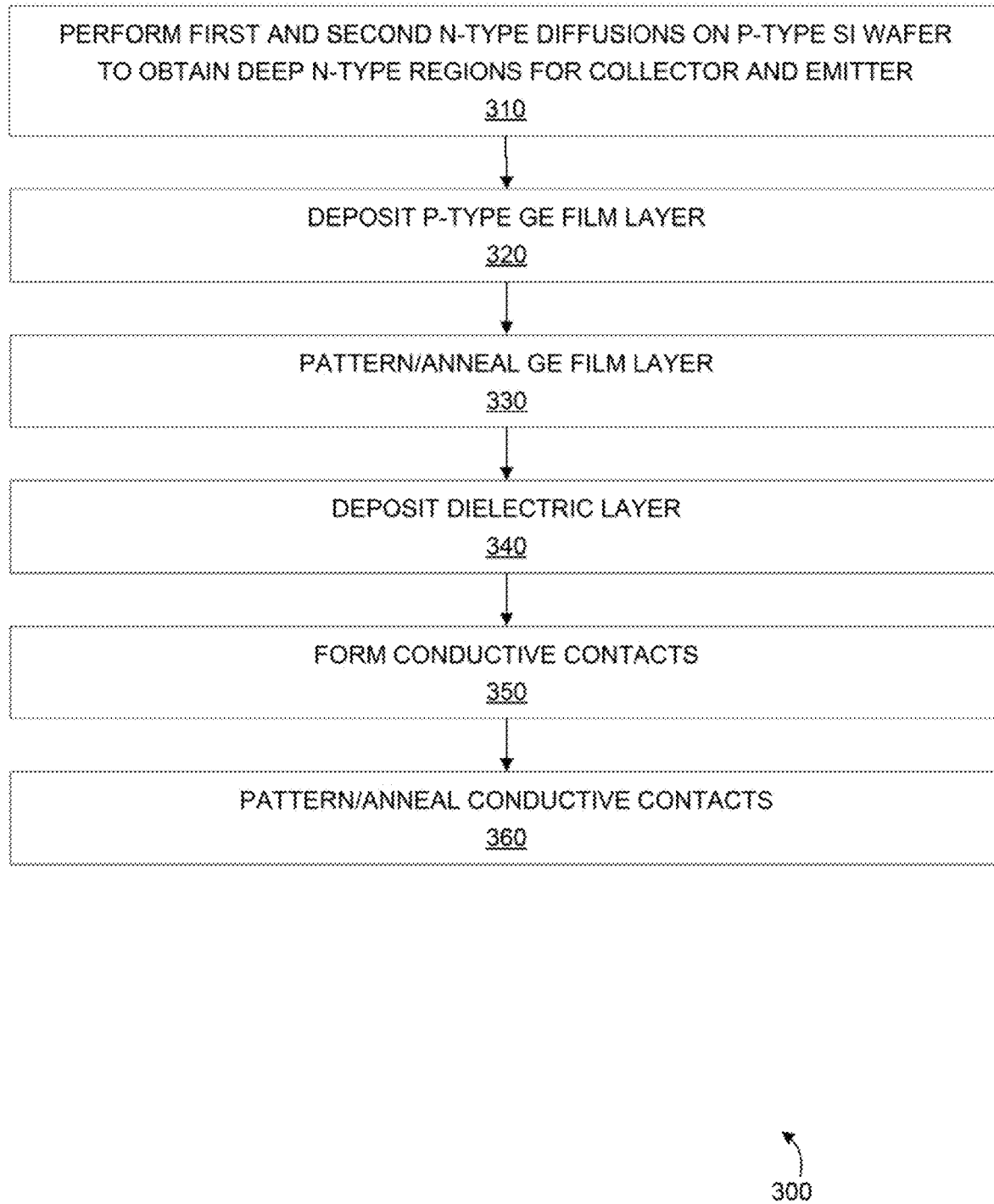
FIG. 3 depicts a flow diagram of a method of fabricating a phototransistor according to an embodiment.

FIG. 3 depicts a flow diagram of a method of fabricating a phototransistor according to an embodiment. Specifically, FIG. 3 depicts a method of fabricating a photo bi-polar junction transistor (PhotoBJT) such as described above using standard silicon-based microfabrication processing technology combined with a silicon deposition step. The method 300 starts with a p-type silicon wafer with an appropriate level of doping (e.g., approximately $10^{17}$ cm³).

At step 310, a first of two n-type diffusions is performed to obtain a deep n-type region configured to minimize the series resistance where metal contact will be made and a second of two n-type diffusions is performed to provide an n-type region overlapping that provided by the first diffusion to form thereby collector and emitter regions of the Photo-BJT. A space between the collector and emitter will remain as a p-type silicon. In various embodiments of the diffusions of step 310, the p-type silicon wafer is oxidized by thermal oxidation or by depositing an oxide using one of many commonly used deposition techniques. Windows for the deep diffusion may be defined using photolithography, and the oxide etched. Ion implantation may be used to introduce Phosphorus and/or Arsenic atoms into the silicon. In some embodiments, phosphorus is a preferred dopant because it diffuses faster and deeper than Arsenic. A second photolithography step may be used to form windows for the shallow diffusion. Ion implantation may be used to introduce Phosphorus and/or Arsenic atoms into the silicon. Arsenic may be used in this diffusion step to keep the diffusion shallow, and the energy used during the ion implantation may be minimized to keep the dopant atoms near the surface. Finally, the silicon wafer may be annealed at a high temperature (e.g., approximately 800° C.-1100° C. is typical) to activate the dopant atoms and drive the dopant atoms deeper into the silicon wafer. While not required, this annealing may be performed using an oxidizing environment. It is noted that the n and n+ regions 122 and 124 may be formed at separate times during fabrication, or in one step. If formed at two separate times, two different doping concentrations that form the emitter and collector may be obtained which may be used to optimize the performance of the bipolar junction transistor (BJT). If regions 122 and 124 are formed in one step, a self-aligned process may be used to provide improved control of the length 140.

At step 320, a Germanium layer is provided on top of the silicon layer to serve as the light collector. This step may include the removal of existing SiO2 from the silicon wafer using hydrofluoric acid or a similar means, preferably immediately prior to the deposition of the Germanium layer to prevent a native oxide from growing on the silicon surface. Then a Germanium layer, nominally 500 nm-1000 nm thick, is deposited. Various methods may be used to deposit this Germanium layer, such as Pulsed Laser Deposition and Plasma-Enhanced Chemical Vapor Deposition at a high substrate temperature; these and other methods may be used to obtain a good quality Ge film. The Germanium layer is doped p-type, which is obtained using one of several methods, such as: (1) relying upon defects in the Germanium that behave as an acceptor; (2) intentionally introducing Boron or other p-type dopant atom during deposition; and (3) introducing the Boron after the deposition, such as via ion implantation.

At step 330, the Germanium layer is patterned using, illustratively, a combination of photolithography and wet chemical etching. Dry chemical etching may also be utilized.

At step 340, the Germanium and Silicon layers are coated with a dielectric layer. In various embodiments, silicon nitride followed by silicon dioxide are deposited using the well-known Plasma-Enhanced Chemical Vapor Deposition technique. Other methods for depositing the dielectric layer may also be used, such as Atomic Layer Deposition, Chemical Vapor Deposition, or chemically through a direct oxidation step.

At step 350, conductive contacts with the collector and emitter are formed. This is performed by first utilizing photolithography to define contact windows, with a subsequent etch of the dielectric layer that exposes the bare silicon surface. In various embodiments, hydrofluoric acid is used to etch through the silicon dioxide layer as well as the silicon nitride layer. Then aluminum is deposited using a thin film deposition technique such as sputtering or evaporation. Various embodiments use sputtering with an aluminum target containing, illustratively, about 1% silicon. This technique is used to minimize the effect of "spiking" when making a metallurgical contact between silicon and aluminum. Various embodiments use a brief dilute hydrofluoric acid dip immediately prior to aluminum deposition to remove any native oxide on the silicon surface.

At step 360, the aluminum is patterned through a combination of photolithography and wet etching, although dry etching is also an option. Finally, the aluminum is annealed using a forming gas anneal at 400° C. to improve the quality of the aluminum contact.

The various embodiments described herein generally comprise a device and related process wherein a Si surface (e.g., surface of Si waveguide of a photonic IC) is: (1) doped N-type, (2) partially covered by SiO2 insulator that serves to limit a p-type Ge film/layer deposited thereon (3) with an appropriate Si—Ge buffer (4) having many atomic layers such that the Ge is a single crystal. Any 1.55 μm light hitting the Ge and building electrons in the Ge/Si base region, which slightly shifts the voltage between the base and the Si emitter, which causes a larger injection of electrons from the Si emitter into the base regions. Since the length of the base of the n-type doped Si surface through the Ge to the second n-type doped-Si service is smaller than the minority carrier diffusion length of electrons in Ge, the injected electrons are caught by the e-field between the base and Si collector. The design is less complex than existing devices.

Various modifications may be made to the systems, methods, apparatus, mechanisms, techniques and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof. As such, the appropriate scope of the invention is to be determined according to the claims.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A phototransistor, comprising:
a p-type silicon substrate having a surface with an elongated n$^-$-doped silicon structure and an elongated n$^+$-doped silicon structure disposed therein in a substantially parallel manner; and
an elongated p-type germanium film disposed between the substantially parallel n$^-$-doped silicon structure and n$^+$-doped silicon structure, the elongated p-type germanium film contacting the silicon substrate surface along each of the parallel n$^-$-doped silicon structure and n$^+$-doped silicon structure and having formed therein a necking portion of the silicon substrate having a length W of approximately 10 μm;
wherein light having a wavelength at which silicon is transparent, but absorbed by germanium, impinges upon the germanium layer causing a buildup of electrons sufficient to shift a base region such that a shift in voltage between a base and silicon emitter causes a larger and readily detectable injection of electrons from an silicon emitter into the base region, and
wherein the elongated p-type germanium film comprises a polycrystalline germanium crystal.

2. The phototransistor of claim 1, wherein the elongated p-type germanium film does not overlap the substantially parallel n$^-$-doped silicon structure and n$^+$-doped silicon structure.

3. The phototransistor of claim 1, wherein the elongated p-type germanium film partially overlaps the substantially parallel n$^-$-doped silicon structure and n$^+$-doped silicon structure.

4. The phototransistor of claim 1, wherein the light wavelength comprises 1.55 μm.

5. The phototransistor of claim 1, further comprising:
a first dielectric region formed at a portion of the substantially parallel n$^-$-doped silicon structure not overlapped by the p-type germanium film; and
a second dielectric region formed at a portion of the substantially parallel n$^+$-doped silicon structure not overlapped by the p-type germanium film.

6. The phototransistor of claim 5, further comprising a third dielectric region overlapping the germanium film.

7. The phototransistor of claim 1, further comprising a dielectric region overlapping the germanium film.

8. A phototransistor, comprising:
- a n-type silicon substrate having a surface with an elongated p⁻-doped silicon structure and an elongated n⁺-doped silicon structure disposed therein in a substantially parallel manner;
- an elongated n-type germanium film disposed between the substantially parallel p⁻-doped silicon structure and n⁺-doped silicon structure, the elongated n-type germanium film contacting the silicon substrate surface along each of the parallel p⁻-doped silicon structure and n⁺-doped silicon structure and having formed therein a necking portion of the silicon substrate having a length W of approximately 10 μm;
- a first dielectric region formed at a portion of the substantially parallel p⁻-doped silicon structure not overlapped by the n-type germanium film; and
- a second dielectric region formed at a portion of the substantially parallel n⁺-doped silicon structure not overlapped by the n-type germanium film;
- wherein light having a wavelength at which silicon is transparent, but absorbed by germanium, impinges upon the germanium layer causing a buildup of charge sufficient to shift a base region such that a shift in voltage between a base and silicon emitter causes a larger and readily detectable injection of holes from an silicon emitter into the base region.

9. The phototransistor of claim 8, wherein the elongated n-type germanium film comprises a single germanium crystal.

10. The phototransistor of claim 8, wherein the elongated n-type germanium film comprises a polycrystalline germanium crystal.

11. The phototransistor of claim 8, wherein the elongated n-type germanium film does not overlap the substantially parallel p⁻-doped silicon structure and n⁺-doped silicon structure.

12. The phototransistor of claim 8, wherein the elongated n-type germanium film partially overlaps the substantially parallel n⁻-doped silicon structure and n⁺-doped silicon structure.

13. The phototransistor of claim 8, wherein the light wavelength comprises 1.55 μm.

14. The phototransistor of claim 8, further comprising a third dielectric region overlapping the germanium film.

15. The phototransistor of claim 8, further comprising a dielectric region overlapping the germanium film.

16. A phototransistor, comprising:
- a p-type silicon substrate having a surface with an elongated n⁻-doped silicon structure and an elongated n⁺-doped silicon structure disposed therein in a substantially parallel manner;
- an elongated p-type germanium film disposed between the substantially parallel n⁻-doped silicon structure and n⁺-doped silicon structure, the elongated p-type germanium film contacting the silicon substrate surface along each of the parallel n⁻-doped silicon structure and n⁺-doped silicon structure and having formed therein a necking portion of the silicon substrate having a length W of approximately 10 μm;
- a first dielectric region formed at a portion of the substantially parallel n⁻-doped silicon structure not overlapped by the p-type germanium film; and
- a second dielectric region formed at a portion of the substantially parallel n⁺-doped silicon structure not overlapped by the p-type germanium film;
- wherein light having a wavelength at which silicon is transparent, but absorbed by germanium, impinges upon the germanium layer causing a buildup of electrons sufficient to shift a base region such that a shift in voltage between a base and silicon emitter causes a larger and readily detectable injection of electrons from an silicon emitter into the base region.

17. The phototransistor of claim 16, wherein the elongated p-type germanium film comprises a single germanium crystal.

18. The phototransistor of claim 16, wherein the elongated p-type germanium film does not overlap the substantially parallel n⁻-doped silicon structure and n⁺-doped silicon structure.

19. The phototransistor of claim 16, further comprising a third dielectric region overlapping the germanium film.

20. The phototransistor of claim 16, further comprising a dielectric region overlapping the germanium film.

* * * * *